US012813010B2

(12) United States Patent
Lin

(10) Patent No.: US 12,813,010 B2
(45) Date of Patent: Nov. 24, 2026

(54) PHOTODIODE STRUCTURE

(71) Applicant: Taiwan-Asia Semiconductor Corporation, Hsinchu City (TW)

(72) Inventor: Chun-Chieh Lin, Hsinchu City (TW)

(73) Assignee: TAIWAN-ASIA SEMICONDUCTOR CORPORATION, Hsinchu City (TW)

( * ) Notice: Subject to any disclaimer, the term of this patent is extended or adjusted under 35 U.S.C. 154(b) by 369 days.

(21) Appl. No.: 18/396,460

(22) Filed: Dec. 26, 2023

(65) Prior Publication Data

US 2024/0213380 A1 Jun. 27, 2024

(30) Foreign Application Priority Data

Dec. 27, 2022 (TW) ................................ 111150241

(51) Int. Cl.
*H10F 77/30* (2025.01)
*H10F 77/14* (2025.01)

(52) U.S. Cl.
CPC ......... *H10F 77/334* (2025.01); *H10F 77/147* (2025.01)

(58) Field of Classification Search
CPC .... H10F 77/334; H10F 77/147; H10F 77/206; H10F 77/306; H10F 77/14; H10F 30/22
See application file for complete search history.

(56) References Cited

U.S. PATENT DOCUMENTS 6,518,638 B1 2/2003 Kuhara et al.
11,009,417 B2 * 5/2021 Yoneda .................. G01P 15/09
2004/0214446 A1 * 10/2004 Kim ...................... C23C 16/401 257/E21.257
2006/0214251 A1 * 9/2006 Ratnam ................ H10F 77/337 257/E31.119
2007/0090394 A1 * 4/2007 Bui ...................... H10F 30/221 257/127
2007/0194357 A1 8/2007 Oohashi et al.
2007/0243656 A1 * 10/2007 Son ...................... H10F 30/223 257/E21.001
2013/0203206 A1 8/2013 Umeda et al.
2018/0329084 A1 11/2018 Karim et al.
2019/0181281 A1 * 6/2019 Ritenour ............... H10F 71/139
2020/0321480 A1 * 10/2020 Semonin ............... H10F 71/131
2021/0098565 A1 * 4/2021 Fernandes ............. H10D 1/692
2023/0268359 A1 * 8/2023 Chavez ................ G01S 7/4814 250/206

(Continued)

*Primary Examiner* — Steven H Loke
*Assistant Examiner* — Khatib A Rahman
(74) *Attorney, Agent, or Firm* — MUNCY, GEISSLER, OLDS & LOWE, P.C.

(57) ABSTRACT

A photodiode structure is provided, which includes a first electrode, a semiconductor structure, a first anti-reflective layer, a second anti-reflective layer, a second electrode, and a blocking structure. The semiconductor structure is located on the first electrode. The first anti-reflective layer is located on the semiconductor structure layer. The second anti-reflective layer is located on the first anti-reflective layer. The second electrode is located on the second anti-reflective layer and penetrates the first anti-reflective layer and the second anti-reflective layer to electrically connect the semiconductor structure. The blocking structure is arranged between the first anti-reflective layer and the second electrode to prevent the first anti-reflective layer from directly contacting the second electrode.

9 Claims, 5 Drawing Sheets

(56) References Cited

U.S. PATENT DOCUMENTS

| | | | | |
|---|---|---|---|---|
| 2024/0105740 | A1* | 3/2024 | Roger | H10F 39/18 |
| 2024/0186435 | A1* | 6/2024 | Xin | H10F 77/14 |
| 2024/0194805 | A1* | 6/2024 | Chang | H10F 77/306 |

* cited by examiner

PHOTODIODE STRUCTURE

CROSS-REFERENCES TO RELATED APPLICATIONS

This application claims the benefit of priority to Taiwanese Patent Application No. 111150241 filed on Dec. 27, 2022, which is hereby incorporated by reference in its entirety.

BACKGROUND OF THE INVENTION

Field of the Invention

The present invention relates to a photodiode structure, in particular to a photodiode structure that can reduce radio frequency interference.

Descriptions of the Related Art

Photodiodes are used to receive external light and output analog electrical signals or to perform switching between different states in the circuit. Currently, photodiodes are widely used in products that require optical measurement. For example, many smart wearable devices use photodiodes to perform functions such as pulse and/or blood oxygen measurement.

However, the aforementioned smart wearable devices often emit radio frequency (RF) signals when performing communication functions. During the transmission process, these radio frequency signals easily enter the interior of the structure through the electrodes of conventional photodiodes and generating the offset voltages. For example, as shown in FIG. 1, the conventional photodiode structure 300 mainly includes a first anti-reflective layer 320 and a second anti-reflective layer 330 sequentially formed on the semiconductor structure 310, and the first anti-reflective layer 320 and the second anti-reflective layer 330 is etched to create a recess to expose the semiconductor structure 310. Then, an electrode 340 is formed at the recess through a metallization process.

The conventional photodiode structure 300 shown in FIG. 1 was subjected to a radio frequency interference test (the radio frequency was approximately 800 MHz). The results are shown in FIG. 2. It is found that when the radio frequency root mean square voltage RF Vrms gradually increases to about 1V, the radio frequency interference RFI begins to significantly decrease and a voltage offset occurs since the first anti-reflective layer 320 is in direct contact with the electrode 340. Accordingly, the conventional photodiode structure 300 will be affected by radio frequency interference, thereby reducing sensing accuracy or performance.

Therefore, how to design a photodiode structure that can improve the aforementioned problems and reduce radio frequency interference is indeed a subject worthy of study.

SUMMARY OF THE INVENTION

The main objective of the present invention is to provide a photodiode structure that can improve luminous brightness.

To achieve the above object, the photodiode structure of the present invention includes a first electrode, a semiconductor structure, a first anti-reflective layer, a second anti-reflective layer, a second electrode, and a barrier structure. The semiconductor structure is disposed on the first electrode; the first anti-reflective layer is disposed on the semiconductor structure; the second anti-reflective layer is disposed on the first anti-reflective layer; the second electrode is disposed on the second anti-reflective layer and penetrates the first anti-reflective layer and the second anti-reflective layer to electrically connect the semiconductor structure; the barrier structure is disposed between the first anti-reflective layer and the second electrode to prevent the first anti-reflective layer from directly contacting the second electrode.

In one embodiment of the present invention, the first anti-reflective layer includes a first hollow portion to expose a portion of the semiconductor structure, and the barrier structure is located in the first hollow portion.

In one embodiment of the present invention, the second anti-reflective layer includes a second hollow portion, and the second hollow portion is formed corresponding to the first hollow portion.

In one embodiment of the present invention, the barrier structure includes a perforated portion to expose a portion of the semiconductor structure, and the radial length of the perforated portion is not greater than the radial length of the second hollow portion.

In one embodiment of the present invention, the barrier structure and the second anti-reflective layer are made of the same material.

In one embodiment of the present invention, the barrier structure is connected to the second anti-reflective layer.

In one embodiment of the present invention, the first anti-reflective layer is made of silicon nitride.

In one embodiment of the present invention, the thickness of the first anti-reflective layer is between 10 nm and 50 nm.

In one embodiment of the present invention, the second anti-reflective layer is made of niobium pentoxide and silicon dioxide.

In one embodiment of the present invention, the thickness of the second anti-reflective layer is between 100 nm and 150 nm.

Accordingly, the photodiode structure of the present invention can effectively improve the problem of radio frequency interference through the arrangement of the barrier structure, so that when the photodiode structure of the present invention is used in smart wearable devices, it cannot be affected by radio frequency signals and improve sensing accuracy or performance.

DETAILED DESCRIPTION OF THE PREFERRED EMBODIMENT

Since various modifications and embodiments are only illustrative and not limiting, after reading this specification, those with ordinary skill in the art may conceive of other variations and embodiments that do not depart from the scope of the present invention. The features and advantages of such embodiments will be further highlighted based on the detailed description and the scope of the claims set forth below.

In this document, the terms "one" or "a" are used to describe the components and elements disclosed herein. This is done for convenience and to provide a general meaning to the scope of the present invention. Therefore, unless otherwise explicitly indicated, such descriptions should be understood to encompass one or at least one, and the singular also includes the plural.

In this document, terms like "first" or "second" and similar ordinal numbers are primarily used to distinguish or refer to similar or analogous components or structures and do not necessarily imply an order in space or time. It should be understood that in certain situations or configurations, ordinal numbers can be used interchangeably without affecting the implementation of the present disclosure.

In this document, terms like "comprising," "including," "having," or any similar expressions are intended to cover non-exclusively inclusive entities. For example, components or structures containing multiple elements are not limited solely to the listed elements in this document but may include other elements that are typically inherent to the component or structure even if not explicitly listed.

Figure 3:
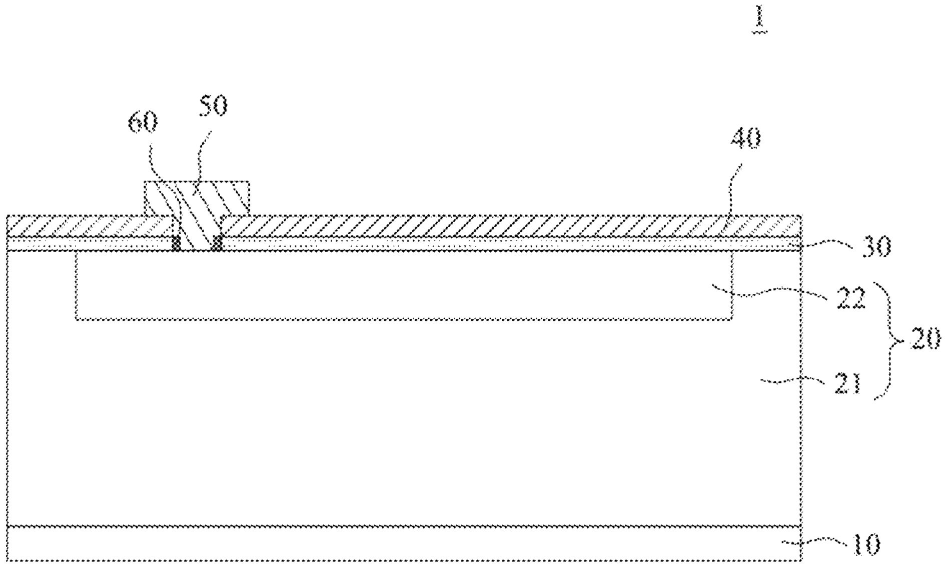
FIG. 3 is a schematic diagram of the photodiode structure of the present invention.
Figure 4A:
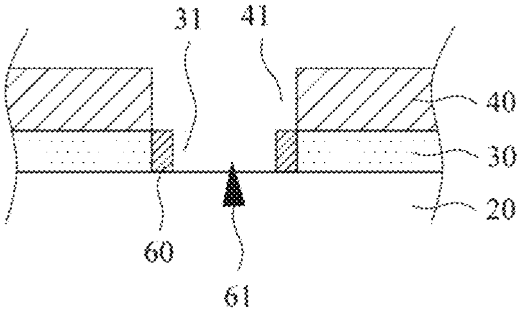
FIG. 4A is a partial schematic diagram of the photodiode structure before forming the second electrode of the present invention.
Figure 4B:
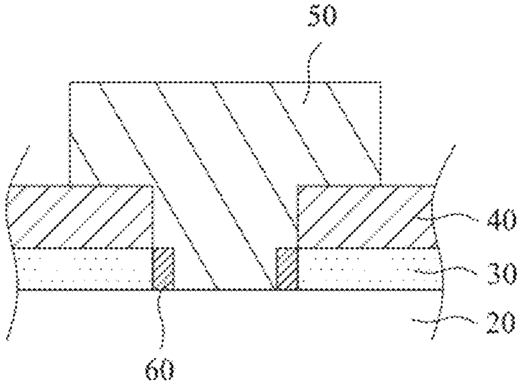
FIG. 4B is a partial schematic diagram of the photodiode structure after forming the second electrode of the present invention.

Please refer to FIG. 3 to FIG. 4B. FIG. 3 is a schematic diagram of the photodiode structure of the present invention. FIG. 4A is a partial schematic diagram of the photodiode structure of the present invention before the second electrode is formed. FIG. 4B is a partial schematic diagram of the photodiode structure of the present invention after the second electrode is formed. As shown in FIG. 3 to FIG. 4B, the photodiode structure 1 of the present invention includes a first electrode 10, a semiconductor structure 20, a first anti-reflective layer 30, a second anti-reflective layer 40, a second electrode 50, and a barrier structure 60. The first electrode 10 is disposed on the surface of one side of the semiconductor structure 20, and the first electrode 10 is formed by performing a metallization process on the aforementioned surface. In the present embodiment, the first electrode 10 is negative, but the present invention is not limited thereto.

The semiconductor structure 20 is located on the first electrode 10. The semiconductor structure 20 is the basic structural component of the photodiode structure 1 of the present invention. The semiconductor structure 20 can be roughly divided into a first semiconductor layer 21 and a second semiconductor layer 22. The first semiconductor layer 21 is mainly made of N-type semiconductor material. The second semiconductor layer 22 is mainly made of P-type semiconductor material so that a PN junction is formed between the first semiconductor layer 21 and the second semiconductor layer 22. The first semiconductor layer 21 of the semiconductor structure 20 is connected to the first electrode 10.

The first anti-reflective layer 30 is disposed on the semiconductor structure 20, and the first anti-reflective layer 30 can cover most of the surface of the semiconductor structure 20. In one embodiment of the present invention, the first anti-reflective layer 30 is formed of silicon nitride (SiNx) through a low-pressure chemical vapor deposition (LPCVD) process. The thickness of the first anti-reflective layer 30 is between 10 nm and 50 nm, but the material and/or thickness of the first anti-reflective layer 30 can be changed according to different design requirements. The first anti-reflective layer 30 forms a first hollow portion 31, through which a portion of the semiconductor structure 20 is exposed.

The second anti-reflective layer 40 is disposed on the first anti-reflective layer 30, and the second anti-reflective layer 40 can cover most of the surface of the first anti-reflective layer 30. In one embodiment of the present invention, the second anti-reflective layer 40 is formed of niobium pentoxide ($Nb_2O_5$) and silicon dioxide ($SiO_2$) materials through a physical vapor deposition (PVD) process, and the thickness of the second anti-reflective layer 40 is between 100 nm and 150 nm, but the material and/or thickness of the second anti-reflective layer 40 can be changed according to different design requirements. The second anti-reflective layer 40 forms a second hollow portion 41, and the position of the second hollow portion 41 corresponds to the position of the first hollow portion 31. In the present invention, the second hollow portion 41 is located substantially directly above the first hollow portion 31, and the radial length of the second hollow portion 41 is not less than the radial length of the first hollow portion 31. For example, if the first hollow portion 31 and the second hollow portion 41 are both cylindrical holes, the aforementioned radial length corresponds to the radial length of the cylindrical holes.

The second electrode 50 is disposed on the second anti-reflective layer 40, and the second electrode 50 penetrates the first anti-reflective layer 30 and the second anti-reflective layer 40 to electrically connect the semiconductor structure 20. Furthermore, the second electrode 50 sequentially passes through the second hollow portion 41 of the second anti-reflective layer 40 and the first hollow portion 31 of the anti-reflective layer 30 along a direction perpendicular to the surfaces of the first anti-reflective layer 30 and the second anti-reflective layer 40, and further contacts the semiconductor structure 20 that exposed on the first hollow portion 31, so that the second electrode 50 and the semiconductor structure 20 can form an ohmic contact. In the present invention, the second electrode 50 is positive, but the present invention is not limited thereto.

The barrier structure 60 is disposed between the first anti-reflective layer 30 and the second electrode 50 to prevent the first anti-reflective layer 30 from directly contacting the second electrode 50. Furthermore, the barrier structure 60 is located in the first hollow portion 31 of the first anti-reflective layer 30, and the thickness of the barrier structure 60 is the same as the thickness of the first anti-reflective layer 30. In the present invention, the barrier structure 60 forms a perforated portion 61 so that a portion of the semiconductor structure 20 originally exposed in the first hollow portion 31 can still be partially exposed through the perforated portion 61. In terms of structural design, the radial length of the perforated portion 61 of the barrier structure 60 is not greater than the radial length of the second hollow portion 41 of the second anti-reflective layer 40. For example, if the perforated portion 61 is a cylindrical hole, the aforementioned radial length is the diameter of the corresponding cylindrical hole.

In one embodiment of the present invention, the barrier structure 60 and the second anti-reflective layer 40 are made of the same materials. For example, after coating the surface of the semiconductor structure 20 with the first anti-reflective layer 30 and forming the first hollow portion 31, the second anti-reflective layer 40 and the barrier structure 60 can be simultaneously formed with the same material through the PVD coating process. Subsequently, the perforated portion 61 of the barrier structure 60 and the second hollow portion 41 of the second anti-reflective layer 40 are formed by using the photolithography etching process. In addition, in one embodiment of the present invention, the barrier structure 60 is connected to the second anti-reflective layer 40 through the same PVD coating process.

Figure 1:
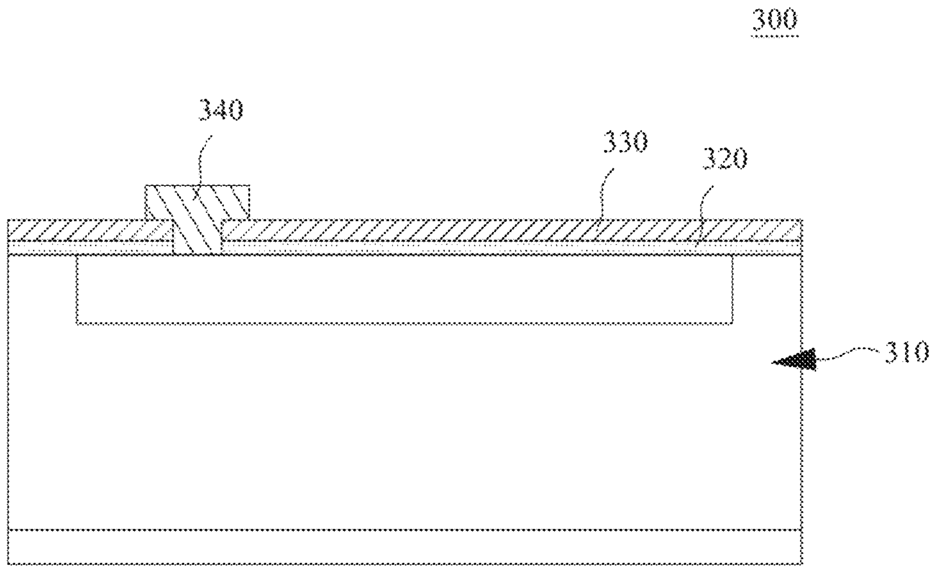
FIG. 1 (Prior Art)
FIG. 1 is a schematic diagram of a conventional photodiode structure.
Figure 2:
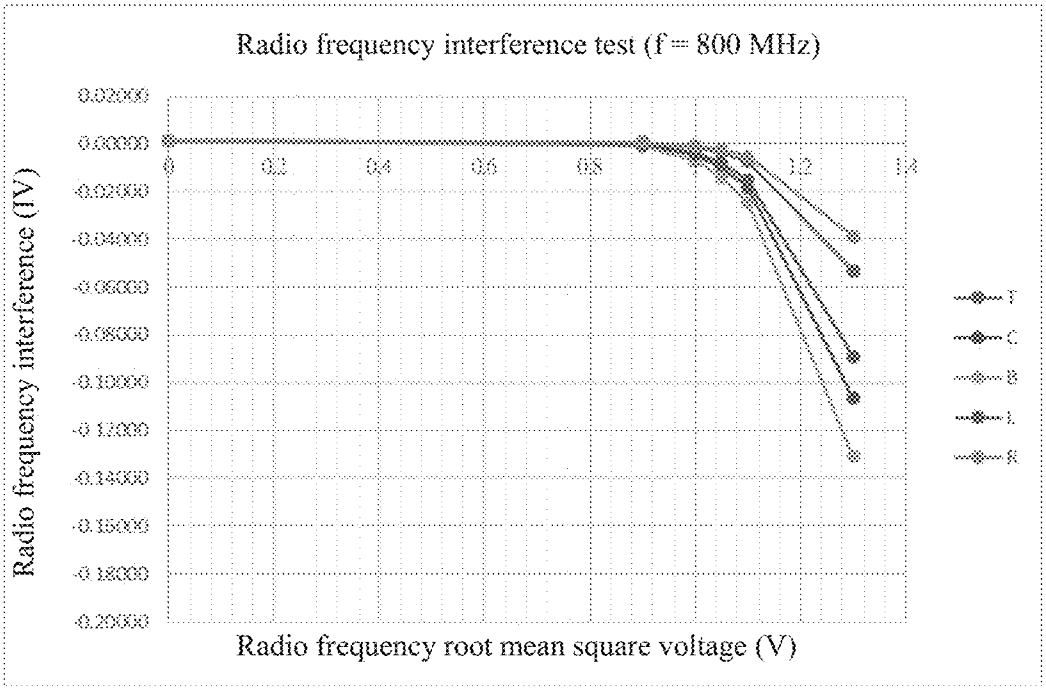
FIG. 2 is a radio frequency interference test result of a conventional photodiode structure.

Please refer to FIG. 1 and FIG. 2 together. According to the conventional photodiode structure 300 illustrated in FIG. 1 and FIG. 2, the first anti-reflective layer 320 directly contacts the electrode 340, so there is no element similar to the barrier structure of the present invention. Based on the test results of the radio frequency interference test (the radio frequency frequency is about 800 MHz), it can be found that when the radio frequency root mean square voltage RF Vrms gradually increases to about 1V, the radio frequency interference RFI begins to significantly decrease and a voltage offset occurs. Therefore, as the radio frequency signal increases, the conventional photodiode structure 300 is susceptible to radio frequency interference.

Figure 5:
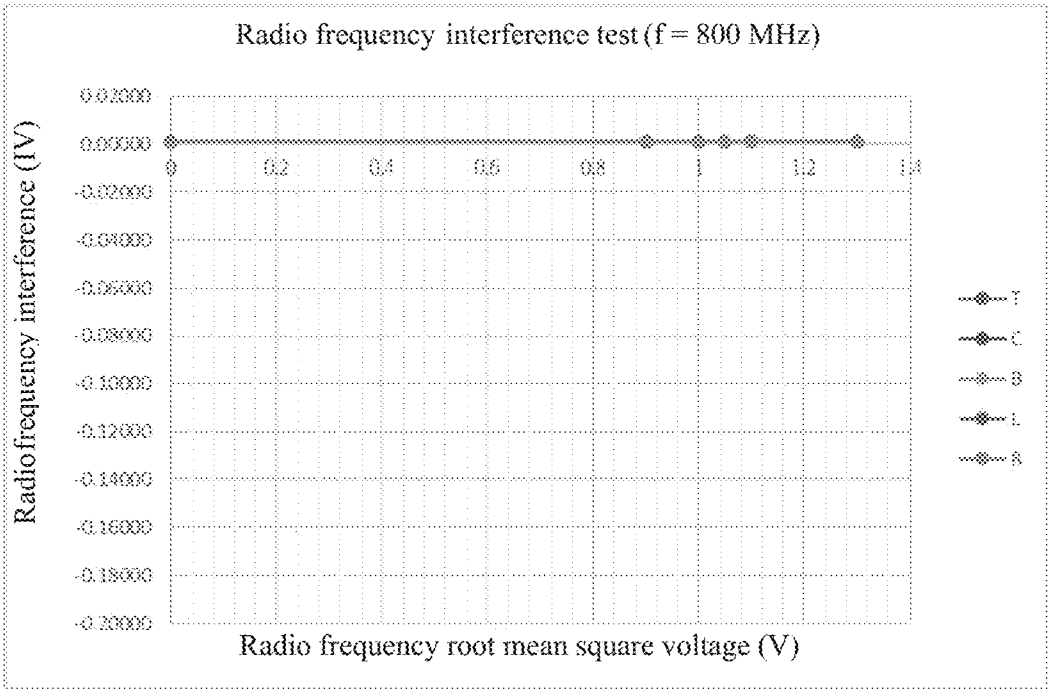
FIG. 5 is a radio frequency interference test result of the photodiode structure of the present invention.

Please refer to FIG. 3 and FIG. 5, wherein FIG. 5 is a radio frequency interference test result diagram of the photodiode structure of the present invention. According to the photodiode structure 1 of the present invention shown in FIG. 3 and FIG. 5, the first anti-reflective layer 30 avoids direct contact with the second electrode 50 through the barrier structure 60. Based on the test results of the aforementioned radio frequency interference test under the same conditions (RF frequency is about 800 MHz), it can be found that even if the radio frequency root mean square voltage RF Vrms gradually increases to about 1.3V, the radio frequency interference RFI remains stable and no voltage deviation occurs. Therefore, the photodiode structure 1 of the present invention is not easily affected by radio frequency interference and is more advantageous than the conventional photodiode structure.

The above embodiments are essentially provided for auxiliary explanation and are not intended to limit the embodiments of the claimed subject matter or their applications or uses. Furthermore, even though at least one illustrative embodiment has been presented in the foregoing embodiments, it should be understood that there can still be numerous variations within the scope of the invention. It should also be understood that the embodiments described herein are not intended to limit the scope, application, or configuration of the claimed subject matter in any way. On the contrary, the foregoing embodiments will provide a convenient guide for those skilled in the art to implement one or more embodiments of the claimed subject matter. Moreover, various changes in the functionality and arrangement of components can be made within the scope defined by the claims, and the claims encompass known equivalents and foreseeable equivalents at the time of filing this patent application.

What is claimed is:

1. A photodiode structure comprising:

a first electrode;

a semiconductor structure disposed on the first electrode;

a first anti-reflective layer disposed on the semiconductor structure;

a second anti-reflective layer disposed on the first anti-reflective layer;

a second electrode disposed on the second anti-reflective layer and penetrating the first anti-reflective layer and the second anti-reflective layer to electrically connect the semiconductor structure; and a barrier structure provided between the first anti-reflective layer and the second electrode to prevent the first anti-reflective layer from directly contacting the second electrode;

wherein the first anti-reflective layer includes a first hollow portion to expose a portion of the semiconductor structure, and the barrier structure is located in the first hollow portion; and wherein the barrier structure contacts and covers an inner wall of the first hollow portion, and a thickness of the barrier structure is the same as a thickness of the first anti-reflective layer.

2. The photodiode structure as claimed in claim 1, wherein the second anti-reflective layer includes a second hollow portion, and the second hollow portion is formed corresponding to the first hollow portion.

3. The photodiode structure as claimed in claim 2, wherein the barrier structure includes a perforated portion to expose a portion of the semiconductor structure, and the radial length of the perforated portion is not greater than the radial length of the second hollow portion.

4. The photodiode structure as claimed in claim 1, wherein the barrier structure and the second anti-reflective layer are made of the same material.

5. The photodiode structure as claimed in claim 4, wherein the barrier structure is connected to the second anti-reflective layer.

6. The photodiode structure as claimed in claim 1, wherein the first anti-reflective layer is made of silicon nitride.

7. The photodiode structure as claimed in claim 1, wherein the thickness of the first anti-reflective layer is between 10 nm and 50 nm.

8. The photodiode structure as claimed in claim 1, wherein the second anti-reflective layer is made of niobium pentoxide and silicon dioxide.

9. The photodiode structure as claimed in claim 1, wherein the thickness of the second anti-reflective layer is between 100 nm and 150 nm.

* * * * *